United States Patent [19]

Lux et al.

[11] Patent Number: 5,446,307
[45] Date of Patent: Aug. 29, 1995

[54] MICROELECTRONIC 3D BIPOLAR MAGNETOTRANSISTOR MAGNETOMETER

[75] Inventors: Robert A. Lux, Toms River, N.J.; James F. Harvey, Research Triangle Park, N.C.; Charles D. Mulford, Jr., Livingston; Louis C. Poli, Hazlet, both of N.J.

[73] Assignee: The United States of America as represented by the Secretary of the Army, Washington, D.C.

[21] Appl. No.: 334,823

[22] Filed: Nov. 4, 1994

[51] Int. Cl.$^6$ ............... H01L 27/22; H01L 29/82; H01L 29/96; H01L 43/00
[52] U.S. Cl. ............... 257/423; 257/426; 257/427; 257/623; 324/252
[58] Field of Search ............... 257/421, 422, 423, 424, 257/425, 426, 427, 619, 623; 324/201, 204, 252

[56] References Cited

U.S. PATENT DOCUMENTS

| | | | |
|---|---|---|---|
| 4,015,148 | 3/1977 | Wallace, Jr. | 257/422 X |
| 4,223,292 | 9/1980 | Morikawa et al. | 257/425 X |
| 5,162,886 | 11/1992 | Nishibayashi et al. | 257/421 |
| 5,179,429 | 1/1993 | Ristic | 257/427 X |
| 5,323,050 | 6/1994 | Ristic | 257/427 X |

FOREIGN PATENT DOCUMENTS 1490656 6/1989 U.S.S.R. ............... 324/252

OTHER PUBLICATIONS

Bates et al, "Integrated Semiconductor Magnetic Field Sensors," Proceedings of IEEE, vol. 74, p. 1107, 1986.
Kordic, "Integrated 3-D Magnetic Sensor Based on an n-p-n Transistor", IEEE Electronic Devices Letters EDL-7, p. 196, 1986.
Kordic et al, "Three Dimensional Magnetic Field Sensors", IEEE Transactions on Electronic Devices, vol. 35, p. 771, 1986.
Nathan et al, "The Hall Effect in Integrated Magnetotransistors", IEEE Transactions on Electronic Devices, vol. 36, p. 108, 1989.

Primary Examiner—William Mintel
Attorney, Agent, or Firm—Michael Zelenka; William H. Anderson

[57] ABSTRACT

A pyramid shaped etch is made in an n or p type silicon substrate, or any symmetric etch with slanted edges, with p or n type implants in the slanted edges of the etch to form a PN junction. On this structure, an emitter and two collectors are formed by further implanting n+ regions in the PN junction region. To complete the device, ohmic contacts are formed to establish a base region. In operation, an appropriate bias is applied to the emitter through to the base and collectors. By so biasing the device, the device operates as a standard bipolar transistor. The currents of both the minority and majority carriers in the base region will respond to the component of the magnetic field perpendicular to the face of the slanted etch. As a result, there will be a difference in the currents in the collectors. These currents can then be simply calibrated to measure the magnetic field component. By forming similar sensors on 3 or 4 of the faces of the etched structure all three components of the magnetic field can be computed.

10 Claims, 2 Drawing Sheets

MICROELECTRONIC 3D BIPOLAR MAGNETOTRANSISTOR MAGNETOMETER

GOVERNMENT INTEREST

The invention described herein may be made, used, sold, and/or licensed by, or on behalf of, the Government of the United States of America without the payment to us of any royalties thereon.

FIELD OF THE INVENTION

The present invention relates generally to the field of microelectronic sensors and more particularly, to sensors that measure magnetic field in three dimensions.

BACKGROUND OF THE INVENTION

Heretofore, microscale Hall two dimensional magnetic sensors, which have been integrated with silicon CMOS technology, have been reported in such publications as, "Integrated Semiconductor Magnetic Field Sensors," by Bates et al, *Proceedings of IEEE*, Vol. 74, page 1107, 1986. Such sensors have several advantages over other two dimensional sensors. These include microscale integration of magnetic sensors with silicon integrated circuits, low cost, light weight, small size, and high volume manufacturing. Additional advantages include the ability to fabricate devices in large arrays, the ability to make measurements over a large cross sectional area simultaneously, and the ability to reconfigure connections between devices to achieve higher sensitivity and lower distortion of the local magnetic field due to the small measuring currents. Despite these advantages, these sensors have not been able to measure the three components of a magnetic field. Although three dimensional sensors capable of integration with silicon microcircuitry have been reported in such publications as, "Integrated 3-D Magnetic Sensor Based on an n-p-n Transistor," by Kordic, *IEEE Electronic Devices Letters EDL*-7, page 196, 1986; "Three Dimensional Magnetic Field Sensors," by Kordic et al, *IEEE Transactions on Electronic Devices*, Vol. 35, page 771, 1986; and "The Hall Effect in Integrated Magnetotransistors," by Nathan et al *IEEE Transactions on Electronic Devices*, Vol 36, page 108, 1989, these devices rely on the magnetic deflection of vertical currents in the bulk region of a silicon microcircuit. In these three dimensional sensors, the three sensors required to measure the three orthogonal directions of the magnetic field do not have identical geometries and sensitivity and therefore, require complex calibration. Accordingly, there exists a need in the magnetic field sensor art to provide for a three dimensional sensor without the need for this complex calibration and yet still have all the advantages of two dimensional sensors. The present invention fulfills such a need.

SUMMARY OF THE INVENTION

Accordingly, one object of the present invention is to provide for a magnetic field sensor that can measure all three orthogonal directions of a magnetic field while being readily incorporated into microcircuits without the need for excessive calibration.

Another object of the present invention is to provide for such a sensor with all the advantages of two dimensional magnetic sensors.

Still a further object of the present invention is to provide for such a sensor which minimizes the distortion of the local magnetic field due to the measurement process.

These and other objects of the invention are achieved by providing for a pyramid shaped, etch in an n or p type silicon substrate, or any symmetric etch with slanted edges, with p or n type implants in the slanted edges of the etch to form a PN junction. With such a structure, an emitter and two collectors can then be formed by further implanting n+ regions in the PN junction region. To complete the device, ohmic contacts are formed to establish a base contact.

In operation, an appropriate bias is applied to the emitter through to the base and collectors. By so biasing the device, the device operates as a standard bipolar transistor. The currents of both the minority and majority carriers in the base region will respond to the component of the magnetic field perpendicular to the face of the slanted etch. As a result, there will be a difference in the currents in the collectors. These currents can then be simply calibrated to measure the magnetic field component. By forming similar sensors on 3 or 4 of the faces of the etched structure all three components of the magnetic field can be computed.

BRIEF DESCRIPTION OF THE DRAWINGS

These and other features of the present invention will become apparent in light of the following Detailed Description of the Invention and referenced drawings wherein.

DETAILED DESCRIPTION OF THE INVENTION

Figure 1:
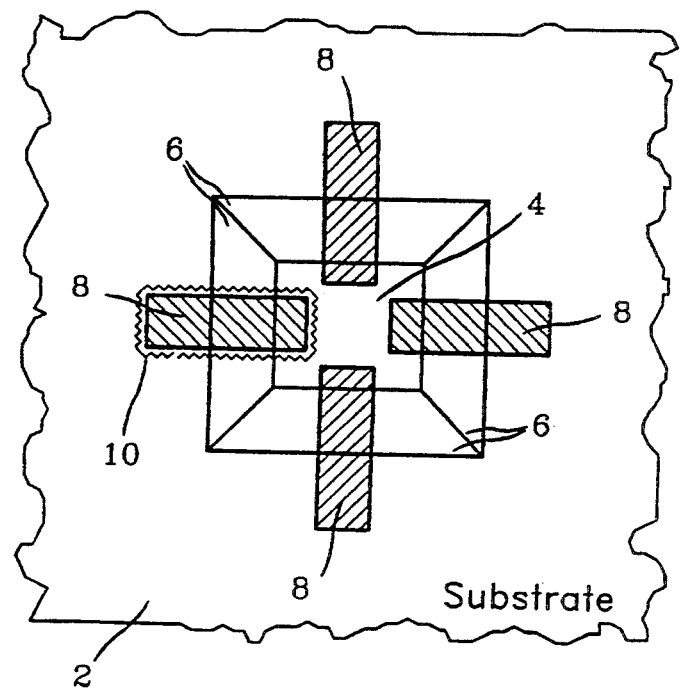
FIG. 1 is a top view of one embodiment of the present invention.

Now referring to the drawings, and in particular FIG. 1, there is shown a top view of one embodiment of the present invention. As shown, an anisotropic etch is used to make an etch cavity 4 in an n type silicon substrate 2 to form a plurality of slanted faces 6 and a horizontal flat surface (labelled as 21 in FIG. 2 and FIG. 4 as 21') at the bottom of the etch cavity 4. In a preferred embodiment of the present invention, the cavity is in the shape of an inverted and truncated pyramidoidal geometric structure with the length of the slanted faces 6 being approximately $5\mu$ in length and the flat bottom surface 21 being $10-20\mu$ in length and width. Regions 8 are implanted with a p type dopant so as to form a PN junction with the silicon substrate, thus electrically isolating the regions 8. A detailed view of portion 10 of the present invention is shown in cross-section in FIG. 2.

Figure 2:
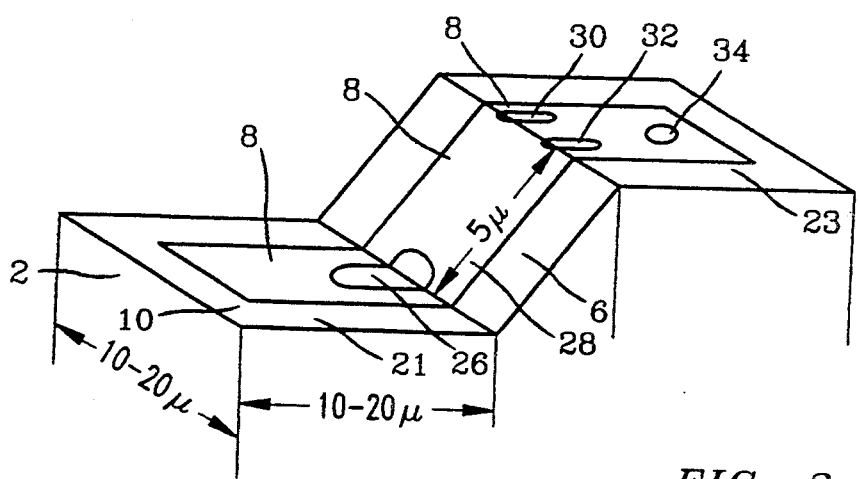
FIG. 2 is a partial cross-section view of one element of the embodiment shown in FIG. 1.

As shown in detail in FIG. 2, regions 8 are formed over the horizontal top surface of the substrate 2, slanted faces 6, and horizontal bottom surface 21. An emitter 26 and two collectors 30 and 32 are formed on the implanted region 8 by doping the region with n type dopants and making ohmic metal contacts. A base region 28 and base contact 34 are formed by making further ohmic metal contacts.

In operation, appropriate biases are applied from the emitter 26 to base 34 and from emitter 26 to collectors 30 and 32. With the configuration as described above, the present invention operates as a standard bipolar transistor. Hence, the currents of both the majority and the minority carriers in the base region 28 will respond to the component of the magnetic field perpendicular to the faces 6. As a result, there will be a difference in the collector currents in the collectors 30 and 32 which can be calibrated to measure the magnetic field component.

In having a plurality of similarly shaped elements 10, all three components of the magnetic field can be computed by known methods to those skilled in the art. Of course, as those skilled in the art will also realize that because the perpendicular directions of the slanted faces 6 are not mutually orthogonal, an additional computation is required to obtain the orthogonal components.

Figure 3:
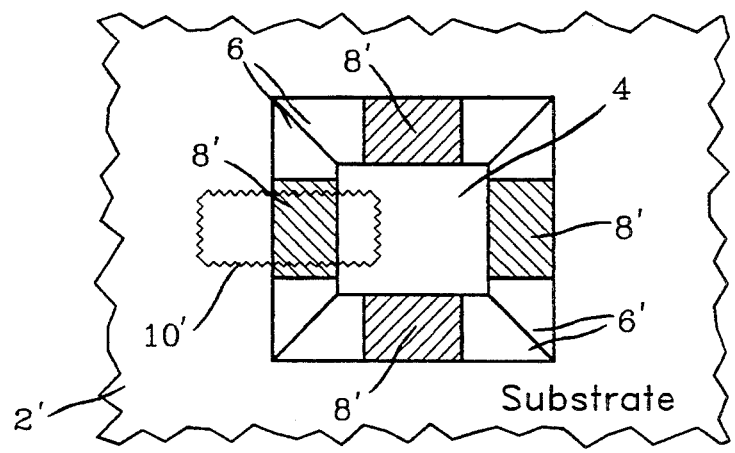
FIG. 3 is a top view of a second embodiment of the present invention.

FIG. 3 shows a top view of an alternate embodiment of the present invention. As shown, an anisotropic etch is used to make an etch cavity 4 in a silicon substrate 2'. However, for this embodiment, the silicon substrate 2' is doped p type and the regions 8' implanted in the slanted faces 6' are implanted as an n+ type. Therefore, a PN junction 20 is formed to electrically isolate the implanted regions 8' on the slanted faces 6'.

Figure 4:
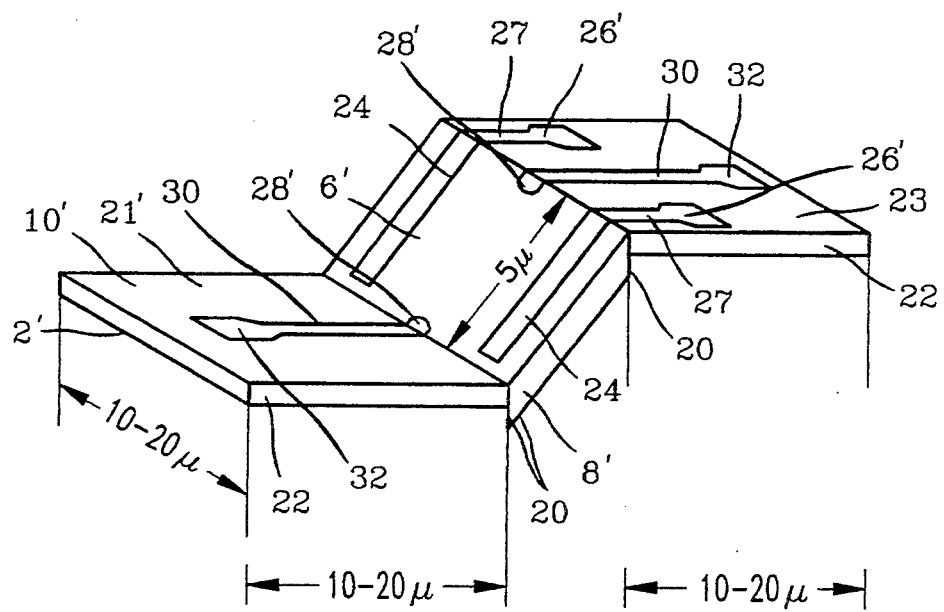
FIG. 4 is a partial cross-section view of one element of the embodiment shown in FIG. 3.

FIG. 4 shows a detailed cross-section of region 10' of FIG. 3. As shown, ohmic metal contacts are formed on the implanted region 8' to form source and drain electrodes 24 in order to measure Hall current. Metal leads 27, which are formed over the upper portion of slanted face 6 and the top 23 of the etched cavity 4, provide the electrical connection to metal contacts 26' on the top surface 23 of the etch cavity 4 to form source and drain contacts from the ohmic metal contacts 24. Another set of ohmic metal contacts are made to the implanted region 8' at both the upper and lower portions of slanted face 6 to form electrodes 28' which will measure the Hall voltage. Metal leads 30 formed on the top 23 and bottom 21' of the etched cavity 4 provide the electrical connection to metal contact pads 32 for the Hall voltage measurements. An insulating layer of $SiO_2$ 22 is deposited to make contact with the source and drain contacts 24 and Hall voltage contacts 28'.

In operation, this second embodiment is also biased similarly to that described in the first embodiment. By running current from the source to the drain contacts 24 and by measuring the Hall voltage between contacts 28', the component of the magnetic field perpendicular to the slanted faces 6 is computed with a simple conversion to its orthogonal component as noted in the description of the first embodiment. By making similar sensors on 3 or 4 of the faces 6 of the etch pit 4, all three components of the magnetic field can be computed. Since the perpendicular directions of the faces 6 of the etch pit 4 are not mutually orthogonal, an additional simple computation is required to extract the 3 orthogonal magnetic field components.

Details of processing steps for both embodiments, for example the manner of lithography used, doping method and amounts, and implantation methods, can all be altered in accordance with the present invention to accommodate various applications; all of these variations in processing will be readily apparent to one skilled in the art. Likewise, the arrangement of the electrical leads and contacts can be similarly altered. In particular, for specific applications it may be desirable to do the measurement computation, processing, and temperature compensation directly on the integrated circuit located next to the sensor. In this case, the electrical leads will go directly to the processing circuit and not to the contact pads. The connections between the individual sensors in an array on a chip can be hard wired or accomplished by more flexible on chip circuitry which can be reconfigured electrically. A sensitivity gain, for the same value of Hall current, can therefore be achieved by connecting the Hall voltage measurements in series for adjacent sensors which have collinear Hall currents. Electrical connections can also be configured to minimize the distortion of the magnetic field due to the Hall currents themselves.

Accordingly, the present invention should not be limited to the prior description, but only by the appended claims.

What is claimed is:

1. A three dimensional magnetometer comprising:
   a silicon substrate having an etched cavity which has a plurality of slanted faces therein and a bottom surface within the etched cavity, the silicon substrate also having a top surface;
   implanted regions formed on at least three of the slanted faces, each implanted region extending from a portion of the top surface of the silicon substrate to a portion of the bottom surface within the etched cavity;
   at least two collector contacts disposed on each of the implanted regions at the top surface of the silicon substrate;
   an emitter contact disposed on each of the implanted regions at the bottom surface of the etched cavity;
   a base region disposed on each of the implanted regions at the slanted face;
   wherein appropriate biases are applied to the emitter contact through to the base region and collector contacts and wherein the currents of both minority and majority carriers in the base region will respond to a component of the magnetic field perpendicular to a face of the slanted edge, whereby there will be a difference in the currents in the collector contacts which are calibrated to measure the magnetic field component.

2. The magnetometer of claim 1 wherein the silicon substrate is n type and the implanted regions are p type so that a pn junction is formed.

3. The magnetometer of claim 2 wherein the emitter and collector contacts are n type and form ohmic metal contacts.

4. The magnetometer of claim 3 further comprising a base contact on the implanted region at the top surface of the silicon substrate and wherein the base region and the base contact are ohmic metal contacts.

5. The magnetometer of claim 4 wherein the etched cavity is in the shape of an inverted and truncated pyramidoidal geometric structure.

6. The magnetometer of claim 5 wherein the length of the slanted faces of the etched cavity are $5\mu$ and the dimensions of the bottom of the etched cavity are 10–20 $\mu$.

7. A three dimensional magnetometer comprising:
   a silicon substrate doped with a p type dopant and having an etched cavity which has a plurality of slanted faces therein and a bottom surface within the etched cavity, the silicon substrate also having a top surface;
   n+ doped implanted regions formed on at least three of the slanted faces, each implanted region extending from a portion of the top surface of the silicon substrate to a portion of the bottom surface within the etched cavity, wherein a pn junction is formed between the implanted regions and the substrate;

source and drain contacts formed on each of the implanted regions at the slanted face, the source and drain contacts having at least first and second metal leads extending over the top surface of the substrate to contact pads disposed on the top surface of the substrate;

at least two metal contacts formed an upper and lower portion of the slanted face, the metal contact formed on the upper portion of the slanted face having a third metal lead extending over the top surface of the substrate to a first metal pad and the metal contact formed on the lower portion of the slanted face having a fourth metal lead extending over the bottom surface within the etched cavity to a second metal pad;

wherein appropriate biases are applied to the source and drain contacts and wherein a Hall voltage can be measured between the two metal contacts such that the component of the magnetic field perpendicular to the slanted face can be measured.

8. The magnetometer of claim 7 wherein the emitter and collector contacts are n type and form ohmic metal contacts.

9. The magnetometer of claim 8 wherein the etched cavity is in the shape of an inverted and truncated pyramidoidal geometric structure.

10. The magnetometer of claim 9 wherein the length of the slanted faces of the etched cavity are $5\mu$ and the dimensions of the bottom of the etched cavity are $10$–$20\mu$.

* * * * *